United States Patent [19]

Okumura et al.

[11] Patent Number: 5,097,333
[45] Date of Patent: Mar. 17, 1992

[54] INTERFRAME DEINTERLEAVE SWITCHING CIRCUIT

[75] Inventors: Naoji Okumura, Ibaraki; Toshihiro Miyoshi, Osaka; Yuichi Ninomiya, Kawasaki; Toshiro Ohmura, Mitaka, all of Japan

[73] Assignees: Matsushita Electric Industrial Co., Ltd.; Nippon Hoso Kyokai, both of, both of Japan

[21] Appl. No.: 499,350
[22] PCT Filed: Oct. 24, 1989
[86] PCT No.: PCT/JP89/01086
    § 371 Date: Aug. 6, 1990
    § 102(e) Date: Aug. 6, 1990
[87] PCT Pub. No.: WO90/04905
    PCT Pub. Date: May 3, 1990

[30] Foreign Application Priority Data
    Oct. 24, 1988 [JP] Japan .................. 63-267449

[51] Int. Cl.⁵ .......................... H04N 7/04; H04N 7/06
[52] U.S. Cl. .................................. 358/143; 358/148; 358/149; 358/181
[58] Field of Search ............... 358/140, 142, 143, 144, 358/146, 147, 149, 148, 198, 17, 18, 20, 181; 370/112; 307/153, 154; 328/243, 244

[56] References Cited

U.S. PATENT DOCUMENTS 4,430,734  2/1984  Hubbard ............................ 370/112
4,837,621  6/1989  Yug .................................. 358/149

FOREIGN PATENT DOCUMENTS 0278171  8/1988  European Pat. Off. .
59-99892  6/1984  Japan .
63-27181  2/1988  Japan .
0169805  2/1988  Japan .
0137890  5/1989  Japan .

Primary Examiner—Victor R. Kostak
Assistant Examiner—Michael H. Lee
Attorney, Agent, or Firm—Mason, Fenwick & Lawrence

[57] ABSTRACT

In processing the transfer of digital voice signals, an interframe deinterleave switching circuit automatically switches the interleaving length without requiring any switching signal from the external unit. The circuit detects a voice synchronizing signal, produces a switching signal when the voice synchronizing signal is not detected, and inputs the switching signal to an interframe deinterleaving circuit (I) so that the interleaving length is automatically switched in synchronism therewith.

2 Claims, 3 Drawing Sheets

INTERFRAME DEINTERLEAVE SWITCHING CIRCUIT

TECHNICAL FIELD

The present invention relates to an interframe deinterleave switching circuit which is capable of automatically switching an interleaving length in interframe deinterleaving operation performed in a high definition television broadcasting system (MUSE system).

BACKGROUND ART

An interframe deinterleaving circuit is employed as a means for dispersing a burst error in the PCM voice signal of the a high definition television broadcast. However, because there is a possibility of employing different interleaving lengths between a transmission system and a package system and therefore a necessity for their switching arises, an interframe deinterleave switching circuit is now under consideration.

For this reason, the description will be directed to an example of the foregoing conventional interframe deinterleave switching circuit with reference to the drawings.

FIG. 4 is a block diagram showing a conventional interframe deinterleave switching circuit and FIG. 5 shows an example of an interframe deinterleaving circuit. In FIG. 4, 1 denotes an interframe deinterleaving circuit. In FIG. 5, 6 to 10 denote shift registers, 11 denotes a selector, 12 denotes a counter, denotes an n-decoding circuit, 14 denotes an m-coding circuit, and 15 denotes a selector.

Hereinafter, the description will be directed to the operation of the interframe deinterleave switching circuit having the foregoing arrangement.

An input signal is passed through n ones of the shift registers 6 to 10, each of which corresponds to one-frame of 1350 clocks of a voice signal. These shift registers thus serve to supply the resulting signals $1_0$, $1_1$, $1_2$, $1_3$, ... $1_{n-2}$, $1_{n-1}$, $1_n$ including the input signal $1_0$.

A counter 12 starts to count at an initial value and sends out the output to an n-decode circuit 13. When the n-decode circuit 13 converts the output into n, a CLEAR signal $f_1$ appears. When the m-decode circuit 14 converts the output into m (m<n), a CLEAR signal $f_2$ appears. Then, the selector 15 switches $F_1$ to $f_2$ in response to a switching signal from the external unit and sends out the output g to the counter 12 for clearing it.

When $f_1$ is conveyed on the switching signal, the counter 12 repeats counts of 0 to n. And, the selector 11 serves to sequentially select one of the input signal $1_0$ and those outputs $1_1$, $1_2$, to $1_{n-1}$, $1_n$ of the shift registers 6 to 10 in response to the output of the counter 12.

The foregoing arrangement, however, has a disadvantage in that it is necessary to pick up a switching signal for an interleave signal from the external unit.

SUMMARY OF THE INVENTION

It is an object of the present invention to provide an interframe deinterleave switching circuit which is capable of automatically switching an interleaving length without requiring a switching signal from the outside.

To achieve this object, the interframe deinterleave switching circuit of the present invention includes a synchronism detecting circuit for detecting a voice synchronizing signal and a switching signal generating circuit for generating a switching signal from the output of the synchronism detecting circuit.

BEST MODE FOR CARRYING OUT THE INVENTION

Figure 1:
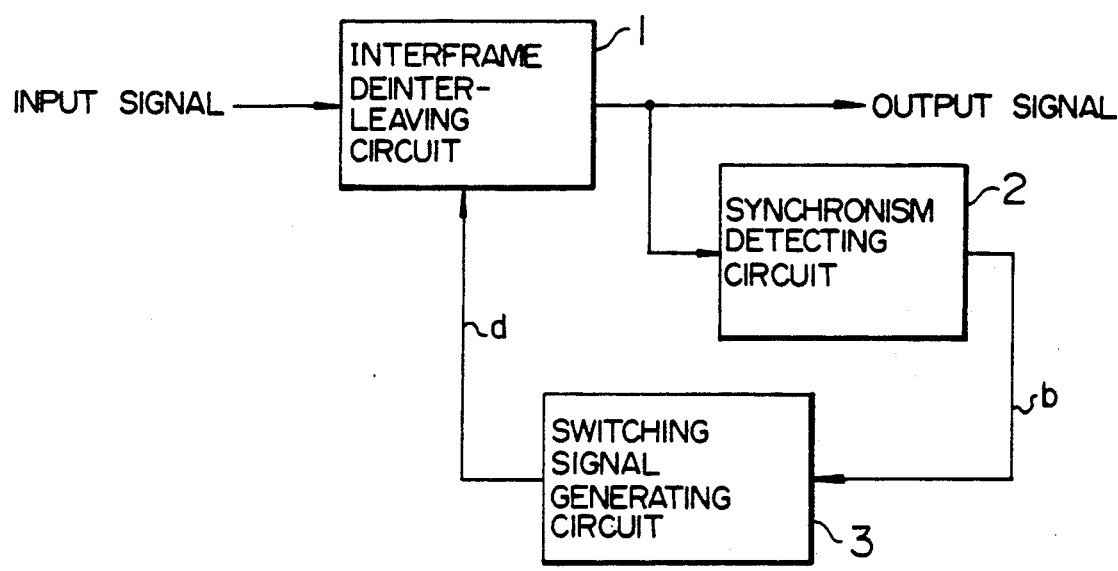
FIG. 1 is a block diagram showing an interframe deinterleaving circuit according to an embodiment of the invention.
Figure 2:
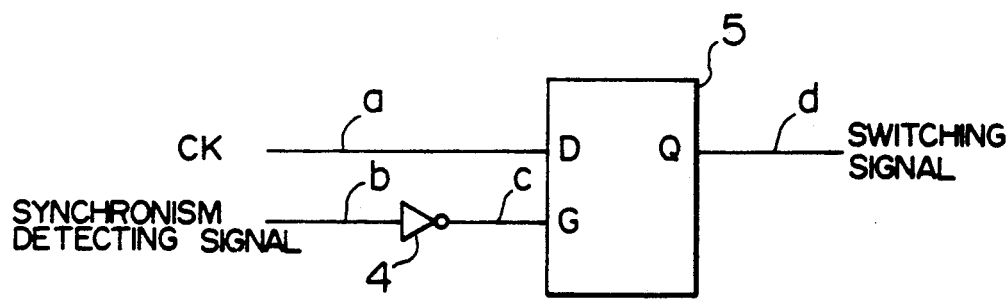
FIG. 2 is a circuit diagram showing a concrete switching signal generating circuit.
Figure 3:
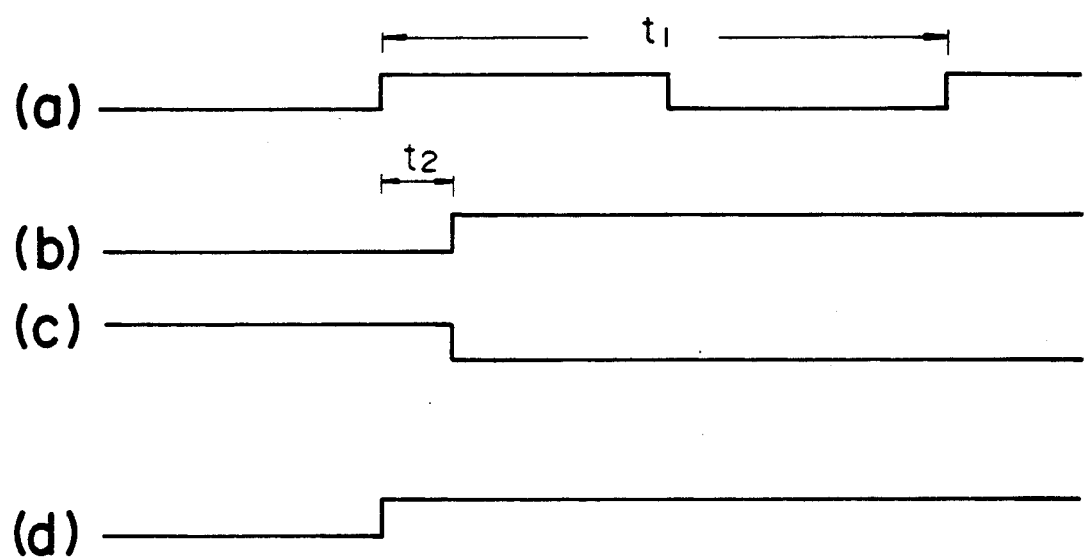
FIG. 3 is a view showing some timings diagrams of the switching signal generating circuit.
Figure 4:
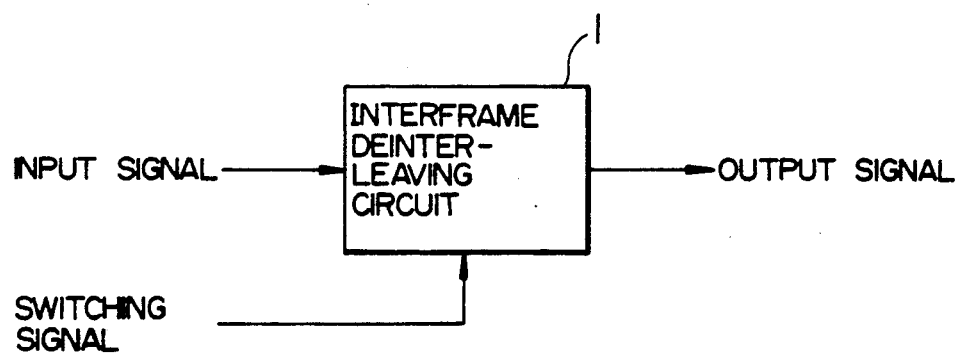
FIG. 4 is a block diagram showing the conventional interframe deinterleave switching circuit.
Figure 5:
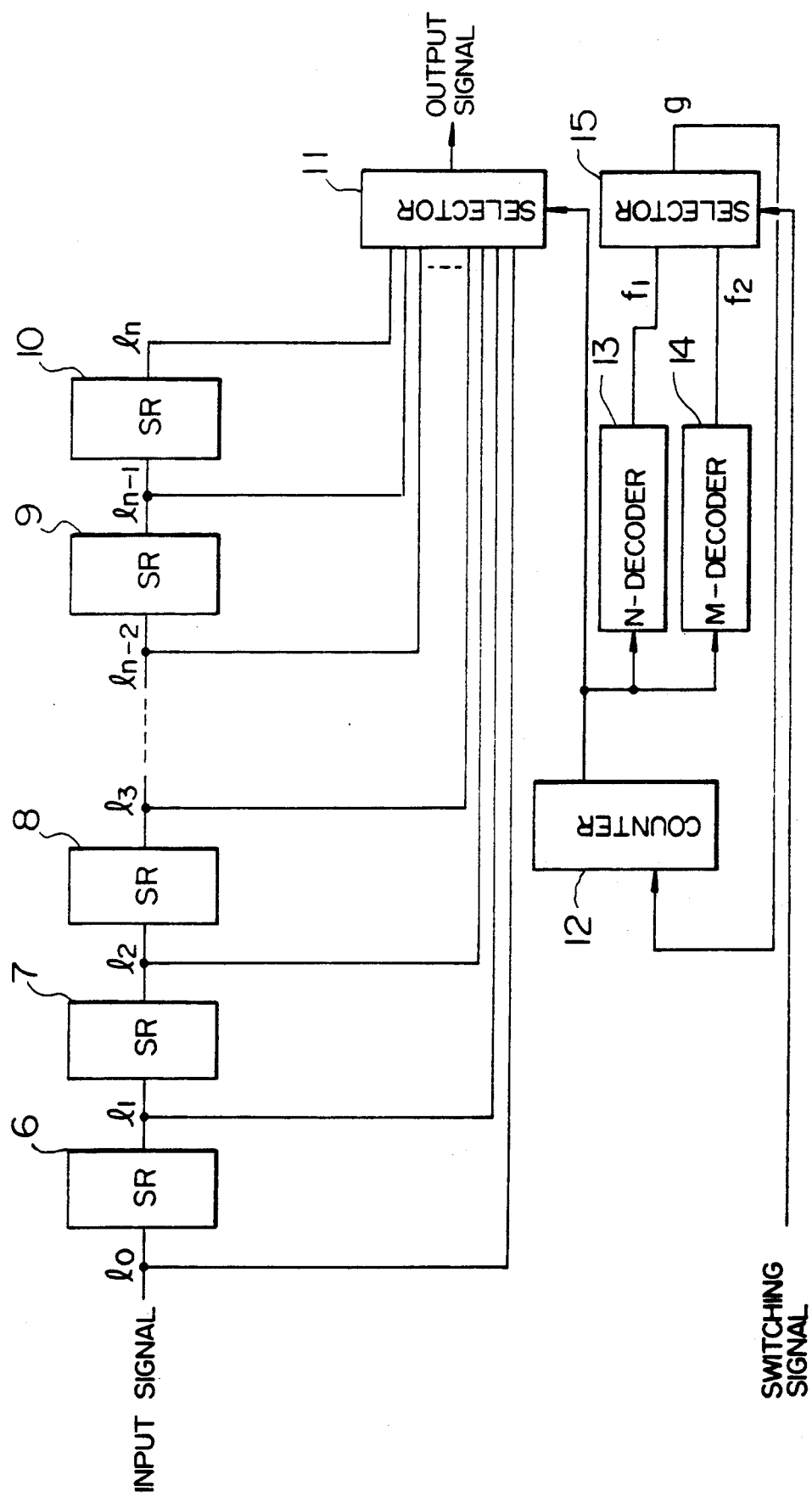
FIG. 5 is a circuit diagram showing a concrete interframe deinterleaving circuit.

Hereinafter, the description will be directed to one embodiment of an interframe deinterleave switching circuit with reference to the drawings. FIG. 1 is a block diagram showing an interframe deinterleave switching circuit according to the embodiment of the invention, FIG. 2 is a circuit diagram showing a concrete circuit of a switching signal generating circuit, and FIG. 3 is a view showing some timing drawings.

In FIG. 1, 1 denotes an interframe deinterleaving circuit, 2 denotes a synchronism detecting circuit for detecting a voice synchronizing signal, 3 denotes a switching signal generating circuit for generating a switching signal, which serves to switch interleaving length, 4 denotes an inverter circuit for inverting a synchronism detecting signal, and 5 denotes a D-latch circuit for generating a switching signal.

The operation of the interframe deinterleave switching circuit having the foregoing arrangement will be described with reference to FIGS. 1, 2, and 3.

An input signal is supplied to the interframe deinterleaving circuit 1 in which the signal is subjected to interframe deinterleaving operation with an interleaving length m. Next, the resulting output is supplied to the synchronism detecting circuit 2 in which a voice synchronizing signal is detected from the output. The synchronism detecting circuit 2 serves to supply as a synchronism detecting signal b a HIGH level signal when it is detected and a LOW level signal when it is not detected. Next, in the switching signal generating circuit 3, the synchronism detecting signal b is inverted in the inverter circuit 4 and results in being a signal c shown in FIG. 3. In the D-latch circuit 5, an input clock a is straightforward used to generate a switching signal d when the signal c is at HIGH level, that is, the synchronism detecting circuit 2 cannot detect a voice synchronizing signal. It means that the switching signal d is changed from LOW to HIGH and thus the interleaving length is changed to n. When the signal c is at LOW level, that is, the synchronism detecting circuit 2 can detect a voice synchronizing signal, the D-latch circuit 5 keeps supplying the state of clock a given at the point in time when the synchronism detecting signal c is at LOW level and the switching signal d keeps the state in which voice synchronizing signal can be detected by the synchronism detecting circuit 2. The period $t_1$ of the clock a is chosen to meet the following relation with a time $t_2$ extending from the change of the switching signal d to the enabling time to detect the synchronism:

$$t_1/2 > t_2$$

As mentioned above, the present embodiment provides the synchronism detecting circuit 2 for detecting a voice synchronizing signal and the switching signal generating circuit 3 in order to switch the switching signal for switching the interleaving length.

INDUSTRIAL APPLICABILITY

According to the present invention, the provision of the synchronism detecting circuit and the switching signal generating circuit makes it possible to automatically switch interleaving length without requiring a switching signal from the external unit.

We claim:

1. An interframe deinterleave switching circuit comprising:

an interframe deinterleaving circuit for changing an interleaving length;

a synchronism detecting circuit for detecting a synchronizing signal from an output of said interframe deinterleaving circuit; and a switching signal generating circuit for generating a switching signal for causing said interframe deinterleaving circuit to switch an interleaving length in response to the output of said synchronism detecting circuit.

2. The interframe deinterleaving switching circuit according to claim 1, wherein two interleaving lengths are provided for the interframe deinterleaving circuit and the switching signal generating circuit consists of a D-latch circuit and an inverter circuit for passing said output of said synchronism detecting circuit to the gate of said D-latch circuit.

* * * * *